Feb. 7, 1967 J. KOCSIS 3,303,071

FABRICATION OF A SEMICONDUCTIVE DEVICE WITH CLOSELY SPACED ELECTRODES

Filed Oct. 27, 1964 2 Sheets-Sheet 1

INVENTOR
J. KOCSIS
BY
Arthur J. Torsiglieri
ATTORNEY

Feb. 7, 1967

J. KOCSIS 3,303,071

FABRICATION OF A SEMICONDUCTIVE DEVICE
WITH CLOSELY SPACED ELECTRODES

Filed Oct. 27, 1964

2 Sheets-Sheet 2

United States Patent Office 3,303,071
Patented Feb. 7, 1967

3,303,071

FABRICATION OF A SEMICONDUCTIVE DEVICE WITH CLOSELY SPACED ELECTRODES

Joseph Kocsis, Jefferson Township, Morris County, N.J., assignor to Bell Telephone Laboratories, Incorporated, New York, N.Y., a corporation of New York Filed Oct. 27, 1964, Ser. No. 406,677
7 Claims. (Cl. 148—187)

Figure 1A:
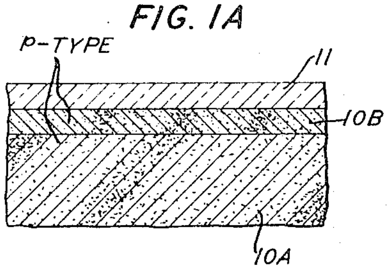

This invention relates to the fabrication of semiconductive devices, particularly semiconductive devices intended for high frequency operation.

In semiconductive devices, the spacing of the electrodes which make electrical connection to the various zones of the semiconductive element is generally related to the frequency at which the device is to operate. For operation at very high frequency, very close spacings are required. For example, in transistors designed for operation at microwave frequencies, the spacing between the emitter and base electrodes typically needs to be as close as a micron. It can be readily appreciated that the manufacture of such a transistor in a reliable and convenient manner poses formidable problems.

Typically, in the past the desired spacing has been achieved by the use of masks during successive evaporations. This method involves the registration of masks to a high degree of accuracy. While feasible, this approach has proved time consuming and generally leads to a high rejection rate.

One object of the present invention is a process for fabrication of semiconductive devices involving closely spaced electrodes which reduces the exacting requirements of registration of masks.

A feature of the invention is a controlled etching step used to undercut an overlying mask an amount comparable to the spacing desired.

In accordance with the invention, a first electrode is deposited on the semiconductive element, an insulating coating is deposited thereover, and a window is cut in the insulating coating localized where the second electrode is desired. A controlled etching step is then used which removes the metal forming the first electrode from the window area and, additionally, undercuts the overlying insulating coating approximately the amount desired for the spacing between the first and second electrodes. Thereafter, the second metal is deposited through the window on the semiconductive wafer. Because of the undercutting, there is no exacting demand on the registry of this second electrode, and the deposit can be permitted to extend over the edges of the window without affecting the effective spacing between the two electrodes.

For purpose of illustration, it will be convenient to describe the invention with reference to the fabrication of a germanium microwave transistor, although, as will be apparent, the principles may be applied to a wide variety of semiconductive devices.

In the drawing:

FIGS. 1A through 1K show in cross-section the transistor in various stages of fabrication in accordance with a typical embodiment of the invention.

The invention has been employed to make a microwave germanium transistor in the following manner.

There was used as the starting material a germanium monocrystalline wafer or element of about 50 mils' diameter and 10 mils' thickness which included a bulk portion of relatively low p-type resistivity, such as .004 ohm-centimeter, and thereover an epitaxial layer of about two microns' thickness of higher p-type resistivity, as is the practice for use in an epitaxial transistor. The wafer had been prepared in the fashion known for making an epitaxial transistor. Thereafter, there was deposited over the epitaxial layer a coating of silicon dioxide about 1500

Angstroms thick. A convenient technique for this involves the thermal decomposition at 640° C. of ethylorthosilicate in a nitrogen atmosphere, although a wide variety of other known techniques are feasible. The resultant is shown in FIG. 1A showing a germanium wafer including the bulk portion 10A and the epitaxial layer 10B, and the overlying silicon dioxide coating 11. Because of some of the minute dimensions involved, it is necessary to distort the scale in this and subsequent figures.

Figure 1B:
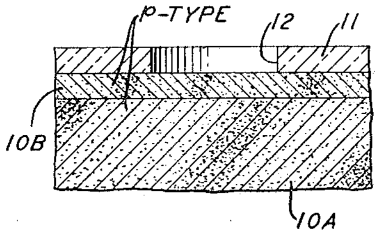

Thereafter, a collector window of rectangular shape about two mils by 1.2 mils was opened up in the oxide in known manner. A convenient technique involves photolithography in the manner now in wide use in the manufacture of silicon planar transistors. This involves the deposit of a photoresist, and irradiation of the photoresist with a desired pattern to form an opening of the desired pattern in the photoresist, the etching of the oxide coating exposed by the opening in the photoresist to form the collector window, and the subsequent removal of the remaining photoresist. One suitable solution for etching the oxide with little effect on the photoresist is formed by mixing 50 milliliters of concentrated hydrogen fluoride, 300 milliliters of water, and 200 grams of ammonium fluoride. The resultant is shown in FIG. 1B, the silicon oxide layer 11 now including the collector window opening 12 where a portion of the surface of epitaxial layer 10B is exposed.

Figure 1C:
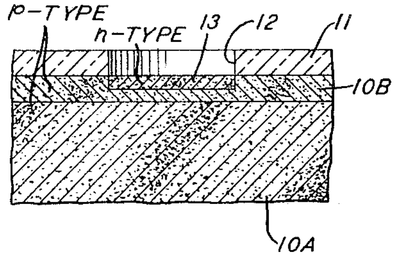

There next followed the base diffusion step used to form the n-type zone 13 shown in FIG. 1C in the epitaxial layer. This involved the vapor-solid diffusion of antimony in known manner through the opening 12. Other diffusants of course are feasible. The diffusion was controlled in this instance to provide a junction depth of about .25 micron with a surface concentration of about $10^{18}$ antimony atoms per cubic centimeter, resulting in a sheet resistance of about 450 ohms per square.

There was then reformed the silicon oxide coating preliminary to the formation of a second collector window of dimensions smaller than that of the first window. This is to extend the oxide layer over the region where the p-n junction formed by zone 13 intersects the surface. The oxide was reformed in essentially the same manner as the original layer except that it was found preferable to utilize an oxygen atmosphere and to heat the wafer only to 500° C. These modifications permitted the reforming with a minimum effect on the antimony-diffused region.

Figure 1D:
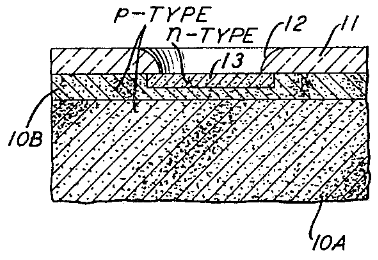
Figure 1E:
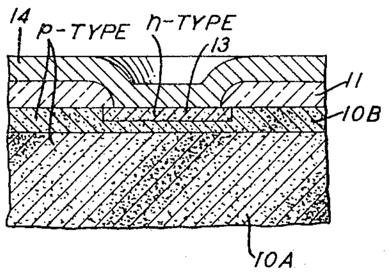

The second collector window was opened up by photolithography in the manner of the first window. The second window was 1.8 mils by 1.0 mil centered over the first window to leave a .1 mil margin along the four sides. As shown in FIG. 1D, these last steps have the principal effect of extending the oxide layer over the intersection of the collector junction with the surface of the wafer. This provides an extra margin to minimize the tendency of the base electrode to short the collector junction, being especially important when silver is used for the base electrode as in the preferred embodiment but being largely superfluous when nickel is used for the base electrode.

Next, there is evaporated in turn over the top of the slice a several hundred Angstroms thick layer of germanium, and a 2000 Angstroms thick layer of silver to form the base electrode. The inclusion of the germanium, while not necessary, improves the adherence of the silver to the oxide. This composite layer is shown as layer 14 in FIG. 1E.

Figure 1F:
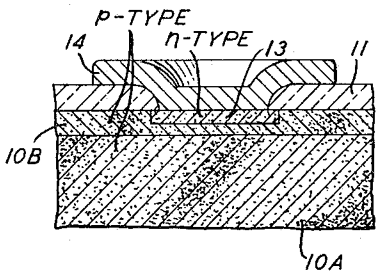

Next, this layer is removed over most of the surface, leaving only a portion 2.5 mils by 1.2 mils centrally located over the n-type region, as shown in FIG. 1F. This removal, too, is done conveniently by known photolithographic techniques. A suitable etchant for removing the composite layer with insignificant effect on the oxide is a solution of ferric nitrate comprising 200 grams of ferric nitrate in 250 milliliters of water.

Figure 1G:
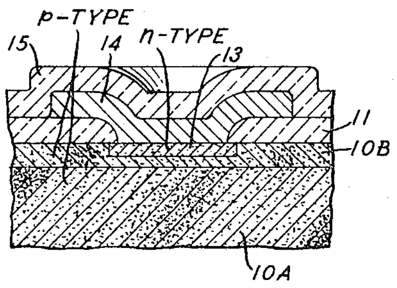

Next, there was deposited a thin layer of silicon dioxide over the surface, again typically about 1500 Angstroms thick, in the manner previously described for reforming the original layer. The resultant is shown in FIG. 1G.

Figure 1H:
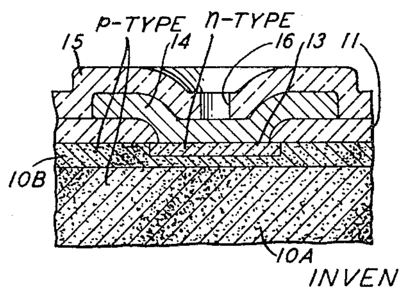

Next, as shown in FIG. 1H, there was formed an opening in this oxide layer about 1.5 mils by 0.2 mil approximately centrally located over the n-type region. This, too, is advantageously done by photolithographic techniques.

Figure 1I:
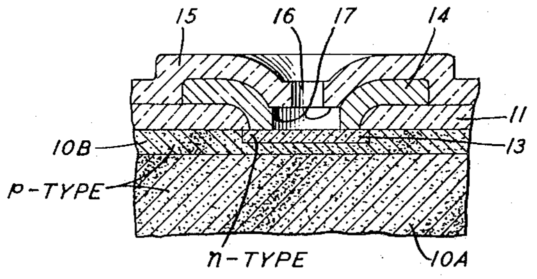

Next, there was etched the silver exposed by the last-formed opening to expose a limited portion of the n-type zone. To this end, there is advantageously employed the ferric nitrate solution described above. In about five seconds, there is removed the silver directly exposed. By continuing the etching, silver will be etched under the oxide, though at a much slower rate. In particular, by continuing the etching for from 15 seconds to 60 seconds longer, undercutting of between 0.5 micron and 1.5 microns is achieved, i.e., the silver has been removed under the oxide layer in a margin between 0.5 micron and 1.5 microns wide surrounding the opening. In this time interval, the etching of the diffused n-type zone will be minor, but, as described below, what etching occurs is advantageous. The resultant is shown in FIG. 1I. For purpose of illustration, the amount of undercutting 17 shown necessarily has been exaggerated.

Figure 1J:
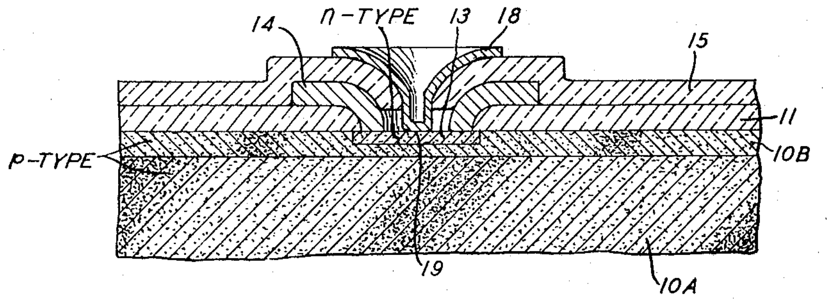

Next, for forming the emitter there was evaporated over the oxide layer and the opening formed therein aluminum in a coating about 1500 Angstroms thick, and the resultant is shown in FIG. 1J. The coating 18 advantageously is made to have a keyhole shape with a portion 1.8 mils by 0.35 mil centered to cover the 1.5 mils by 0.2 mil opening in the oxide layer and overlap the surrounding oxide layer. Additionally, for contacting purposes there is included attached to one end of this narrow portion a portion widened to about 0.8 mil and 0.8 mil long. Advantageously, a 10 percent solution of sodium hydroxide is used as an etchant to shape the aluminum overlay. The earlier removal of the silver around the perimeter of the opening ensures that there will be no shorts between the silver used to contact the base zone and the aluminum used to form the emitter zone.

It can be appreciated that this technique results in a very close spacing of the silver base contact and the aluminum emitter with reduced registry requirements. Moreover, since the removal of the silver around the perimeter of the emitter window will follow the irregularities of the perimeter of the window, there are no very critical requirements on the preceding steps.

Finally, it is advantageous to alloy or sinter the aluminum to improve the emitter injection efficiency. In particular, sintering an aluminum coating for 400° C. for several minutes gave results comparable to the use of an alloy emitter, with less stringent control requirements. The fact that eutectic runaway cannot occur in a sintering operation permits more aluminum to be used with a consequent reduction in the resistance. Sintering results in a diffused junction with smaller emitter depletion layer capacitance and a higher emitter breakdown voltage than for an alloy junction.

Figure 1K:
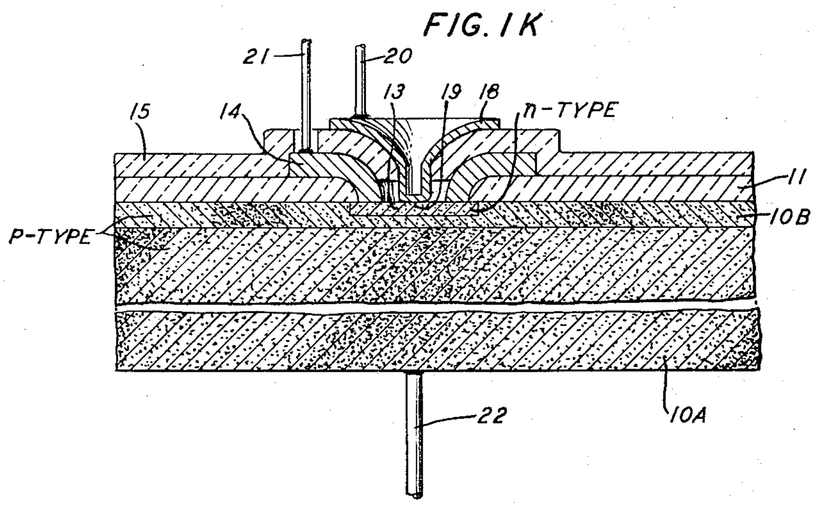

The completed basic structure is shown in FIG. 1K. In this figure, the scale has been expanded for increased clarity. A p-type emitter zone 19 underlies the aluminum coating. Emitter, base, and collector leads 20, 21, and 22, respectively, are provided to the corresponding regions in known fashion, such as by thermocompression bonding. Typically, it will be desirable to etch the oxide to form an opening for connecting the base lead 21 to the base electrode. Typically, the structure is also encapsulated in a conventional microwave package for use.

An additional advantage is provided by the selective etching step used to remove silver underlying the perimeter of the window. It will be characteristic of the resultant of this step that the sheet resistivity of the n-type diffused region will be at a minimum underlying the silver base electrode and at a maximum underlying where the emitter region will be formed. Where the base metal connection was undercut, the sheet resistance will vary gradually, decreasing toward the edge of the base metal since the germanium was etched for a shorter time the longer it was protected by the silver. The shorter the time etched the lower the sheet resistivity, since the lower the concentration of the diffusant the deeper the penetration into the diffused base zone. This difference in sheet resistivity is desirable since a high sheet resistivity underlying the emitter advantageously results in an improved emitter injection efficiency, whereas a low sheet resistivity underlying the base connection advantageously results in a reduced effective base resistance.

It can be appreciated that the principles embodied in the process described have application to the fabrication of other devices, such as diodes and integrated circuits, where close spacing, of the order of magnitude of a micron, of two or more electrodes is desired. Similarly, the principles are applicable to other processes utilizing, for example, other materials either as the semiconductor, the insulating material undercut, the etchants employed, or the contact metals. Additionally, consistent with the invention, various techniques other than those disclosed can be used for depositing the various metallic and insulating layers and for forming openings of the desired patterns in such layers.

What is claimed is:

1. The method of making a semiconductive device comprising the steps of depositing on a surface of a semiconductive wafer a first layer of an insulating material, removing a portion of the layer for forming an opening therein and exposing the underlying portion of the semiconductive wafer, diffusing a significant impurity into the semiconductive wafer through said opening for forming therein a localized impurity diffused region, depositing a first conductive coating extending over a portion of the layer and over the opening in said layer for forming a first electrical connection to the impurity-diffused region of the wafer, depositing a second layer of insulating material over at least the portion of said conductive coating overlying the impurity-diffused region of the wafer, removing a portion of said second layer for forming an opening therein and exposing a portion of the conductive coating which overlies a portion of the impurity-diffused region of the wafer, treating the exposed portion of the coating with an etchant for removing said exposed conductive coating as well as an additional portion of the conductive coating underlying the perimeter of the opening in the second layer by undercutting the opening in said second layer, thereby forming an opening in the conductive coating larger than the opening in the second layer for re-exposing a limited portion of the impurity-diffused region of the wafer, evaporating a second conductive coating through the opening in the first coating for forming a second electrical connection to the impurity-diffused region of the wafer spaced from the first electrical connection essentially by the amount of said undercutting, and heating the wafer for introducing some of the material of said second coating into the impurity-diffused region and forming a region of the opposite conductivity type within said impurity-diffused region.

2. The method of claim 1 in which the semiconductive wafer is of germanium, the insulating layers are of silicon dioxide, the first conductive coating is silver, and the second conductive coating is aluminum.

3. The method of making a microwave transistor comprising the steps of depositing on a surface of a germanium wafer a first layer of an insulating material,
forming an opening in the layer for exposing the underlying portion of the germanium wafer,
introducing a significant impurity into the wafer through said opening for forming therein a p-n junction separating a first region of one conductivity type from a second region of the opposite conductivity type,
depositing a first conductive coating which extends over the opening in said layer for forming an electrical connection to the first region,
depositing a second layer of insulating material over said conductive coating,
opening a hole in said second layer for exposing a portion of the coating which overlies a portion of the first region of the wafer,
exposing the exposed portion of the coating to an etchant for removing said exposed coating and undercutting the opening in said second layer, thereby forming an opening in the coating and re-exposing a portion of the first region,
and evaporating a second conductive coating through the opening in the first-mentioned coating for forming a second electrical connection to the first region spaced from the first electrical connection essentially by the amount of the undercutting of the second layer.

4. The method of claim 3 in which the insulating layers are essentially of silicon dioxide.

5. The method of providing a pair of electrode connections spaced apart of the order of a micron on a semiconductive wafer comprising the steps of
depositing a first metallic coating on said wafer for forming a first electrode connection to the wafer,
depositing an insulating layer over at least a portion of said layer,
forming an opening in said insulating layer for exposing a portion of said metallic coating,
etching the exposed portion of said coating for exposing the semiconductive wafer and for undercutting a portion of the surface of the insulating layer around the perimeter of the opening a distance of the order of a micron,
depositing a second metallic coating extending over the opening in the insulating layer for forming a second electrode connection to the wafer spaced from the first electrode connection essentially by the amount of said undercutting.

6. The method of making a germanium microwave transistor comprising the steps of
depositing a layer of silicon dioxide on an epitaxial surface layer of a germanium wafer, the wafer comprising a low resistivity bulk portion and a high resistivity epitaxial surface layer,
forming an opening in said layer by photolithographic techniques,
diffusing a significant impurity through said opening for forming in the epitaxial layer the base zone of the transistor,
reforming the silicon dioxide layer and extending it over the region where the edge of the base zone intersects the surface,
depositing a metallic coating over the silicon dioxide layer for contacting the base zone,
depositing a silicon dioxide layer over said metallic coating,
forming an opening by photolithographic techniques in said last-mentioned oxide layer for exposing a portion of said metallic coating,
etching the exposed portion of said metallic coating for forming an opening therein for exposing a portion of the base zone and for undercutting the perimeter of the opening in the last-mentioned oxide layer,
evaporating a second metallic coating for contacting the base zone over an area corresponding essentially to the opening in the last-mentioned oxide layer, the first and second metallic coatings being spaced apart on the base zone a distance of the order of a micron,
heating the wafer for introducing atoms of the second metallic coating into a limited portion of the base zone for forming an emitter zone thereof,
and providing an emitter lead to the second metallic coating, a base lead to the first metallic coating, and a collector lead to the low resistivity bulk portion of the wafer.

7. The method of claim 6 in which the second metallic coating is aluminum and aluminum atoms are introduced into the base zone for forming the emitter zone by heating below the eutectic for diffusion therein.

References Cited by the Examiner

UNITED STATES PATENTS

| | | | |
|---|---|---|---|
| 3,200,019 | 8/1965 | Scott et al. | 148—187 X |
| 3,206,339 | 9/1965 | Thornton | 184—175 |
| 3,243,323 | 3/1966 | Corrigan | 156—17 X |

References Cited by the Applicant

UNITED STATES PATENTS

| | | |
|---|---|---|
| 2,821,493 | 1/1958 | Carman. |
| 2,981,877 | 4/1961 | Noyce. |

HYLAND BIZOT, *Primary Examiner.*